(12) United States Patent (10) Patent No.: US 7,411,421 B1
Steinke et al. (45) Date of Patent: Aug. 12, 2008

(54) APPARATUS AND METHOD FOR GENERATING DIFFERENTIAL SIGNAL USING SINGLE-ENDED DRIVERS

(75) Inventors: Gregory R. Steinke, San Jose, CA (US); Hima Bindu Yalamati, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 54 days.

(21) Appl. No.: 11/296,895

(22) Filed: Dec. 7, 2005

(51) Int. Cl.
*H03K 19/094* (2006.01)
*H03K 19/0175* (2006.01)

(52) U.S. Cl. .......................... 326/83; 326/86; 327/109; 327/333

(58) Field of Classification Search ............. 326/82–83, 326/86–87; 327/108–109, 333
See application file for complete search history.

(56) References Cited

U.S. PATENT DOCUMENTS 5,216,297 A * 6/1993 Proebsting .................... 326/73
7,227,390 B1 * 6/2007 Bapat et al. .................. 327/108
2006/0220674 A1 * 10/2006 Yeung et al. ................... 326/29

* cited by examiner

*Primary Examiner*—Rexford Barnie
*Assistant Examiner*—Jason M Crawford
(74) *Attorney, Agent, or Firm*—Martine Penilla & Gencarella, LLP

(57) ABSTRACT

A first pair of single-ended drivers, each having a respective output connected to a first line of a differential channel, are defined to work against each other with respect to driving a first signal on the first line of the differential channel. A second pair of single-ended drivers, each having a respective output connected to a second line of the differential channel, are defined to work against each other with respect to driving a second signal on the second line of the differential channel. Each of the first pair of single-ended drivers and each of the second pair of single-ended drivers is connected to receive a common input signal. A difference between the first signal on the first line of the differential channel and the second signal on the second line of the differential channel defines a differential signal that is representative of the common input signal.

20 Claims, 8 Drawing Sheets

APPARATUS AND METHOD FOR GENERATING DIFFERENTIAL SIGNAL USING SINGLE-ENDED DRIVERS

BACKGROUND

TTL (transistor-transistor logic) signaling is commonly used to communicate data between devices present on a printed circuit board (PCB). For example, a field programmable gate array (FPGA) present on a PCB may use TTL signaling to communicate data to another device present on the PCB. Those skilled in the art will appreciate that TTL signaling has traditionally provided a reliable mechanism for communicating digital data between devices. However, as data transfer requirements continue to increase, limitations associated with TTL signaling become more problematic.

Because rather large amplitude signals are used in TTL signaling, it takes a relatively long time to swing between rail voltages. Also, a high capacitance associated with TTL signals, when combined with a bus structure, causes edges of the TTL signals to be attenuated. Consequently, a maximum frequency of TTL signals traveling through a PCB is limited to less than 200 MHz. Additionally, TTL signals tend to consume large amounts of power at higher frequencies due to the wide signal swing and high capacitance. Therefore, in applications requiring higher bandwidth/higher speed data transmission, the TTL signaling approach can be less than optimal.

When higher bandwidth/higher speed data transmission is needed, a LVDS (low voltage differential signaling) method can be used instead of the TTL signaling method. As those skilled in the art will appreciate, relative to the TTL signaling method, the LVDS method provides faster bit rates, lower power consumption, and better noise performance. Because data transmitted using the LVDS method is represented by a differential voltage between two transmission lines carrying equal and opposite currents, the transmitted data represented by the differential voltage is immune to common-mode noise. Additionally, LVDS lowers voltage swings to about 300 mV. Thus, LVDS differential signals can change state very fast. Furthermore, the low voltage swing of LVDS provides reduced power consumption.

Even though LVDS has certain advantages over TTL signaling, both LVDS and TTL signaling continue to be used for data communication, depending on the particular application. When designing an FPGA to be used in a wide variety of applications, it is necessary to provide both TTL signaling and LVDS capability. Thus, the available FPGA output buffers need to provide a sufficient number of single-ended TTL drivers for TTL signaling and a sufficient number of differential drivers for LVDS. Consequently, to support the wide variety of potential applications, the cost of the FPGA includes the cost of both the TTL drivers and the differential drivers. For FPGA end-users that do not require the full LVDS capability of the FPGA, the included cost of the unused differential drivers is wasted. Similarly, for FPGA end-users that do not require the full TTL signaling capability of the FPGA, the included cost of the unused TTL drivers is wasted.

In view of the foregoing, a solution is needed for providing an FPGA that includes both TTL signaling capability and LVDS capability in a more economical manner.

SUMMARY

In one embodiment, a circuit is disclosed for generating a differential signal. The circuit includes a first pair of single-ended drivers each having a respective output connected to a first line of a differential channel. The first pair of single-ended drivers are defined to work against each other with respect to driving a first signal on the first line of the differential channel. The circuit also includes a second pair of single-ended drivers each having a respective output connected to a second line of the differential channel. The second pair of single-ended drivers are defined to work against each other with respect to driving a second signal on the second line of the differential channel. Additionally, each of the first pair of single-ended drivers and each of the second pair of single-ended drivers is connected to receive a common input signal. A difference between the first signal on the first line of the differential channel and the second signal on the second line of the differential channel defines a differential signal that is representative of the common input signal.

In another aspect of this embodiment, a weaker driver in the first pair of single-ended drivers is defined as an inverting driver capable of sinking electrical current from the first line of the differential channel when the common input signal represents a high logic state. A stronger driver in the first pair of single-ended drivers is defined as a non-inverting driver capable of sourcing electrical current to the first line of the differential channel when the common input signal represents the high logic state. In a converse manner, when the common input signal represents a low logic state, the weaker inverting driver of the first pair of single-ended drivers is defined to source electrical current to the first line of the differential channel. Also, when the common input signal represents the low logic state, the stronger non-inverting driver of the first pair of single-ended drivers is defined to sink electrical current from the first line of the differential channel.

In yet another aspect of this embodiment, a stronger driver in the second pair of single-ended drivers is defined as an inverting driver capable of sinking electrical current from the second line of the differential channel when the common input signal represents a high logic state. The weaker driver in the second pair of single-ended drivers is defined as a non-inverting driver capable of sourcing electrical current to the second line of the differential channel when the common input signal represents the high logic state. In a converse manner, when the common input signal represents a low logic state, the stronger inverting driver in the second pair of single-ended drivers is defined to source electrical current to the second line of the differential channel. Also, when the common input signal represents a low logic state, the weaker non-inverting driver in the second pair of single-ended drivers is defined to sink electrical current from the second line of the differential channel.

In another embodiment, a field programmable gate array output buffer is disclosed. The output buffer includes a first inverting single-ended driver having an input connected to receive a logic signal to be transmitted by the output buffer. The first inverting single-ended driver has an output connected to a first line of a differential channel. The output buffer also includes a first non-inverting single-ended driver having an input connected to receive the logic signal to be transmitted by the output buffer. As with the first inverting single-ended driver, the first non-inverting single-ended driver also has an output connected to the first line of the differential channel. Additionally, the first non-inverting single-ended driver is defined to have a stronger drive strength than the first inverting single-ended driver. The output buffer further includes a second inverting single-ended driver having an input connected to receive the logic signal to be transmitted by the output buffer. The second inverting single-ended driver has an output connected to a second line of the differential channel. The output buffer also includes a second non-inverting single-ended driver having an input connected to receive the logic signal to be transmitted by the output buffer. As with the second inverting single-ended driver, the second non-inverting single-ended driver also has an output connected to the second line of the differential channel. Additionally, the second non-inverting single-ended driver is defined to have a weaker drive strength than the second inverting single-ended driver.

In another aspect of this embodiment, the first inverting single-ended driver is defined to sink electrical current from the first line of the differential channel when the logic signal represents a high logic state. In a simultaneous manner, the first non-inverting single-ended driver is defined to source electrical current to the first line of the differential channel when the logic signal represents the high logic state. Also, when the logic signal represents a low logic state, the first inverting single-ended driver is defined to source electrical current to the first line of the differential channel, while the first non-inverting single-ended driver is defined to sink electrical current from the first line of the differential channel. Thus, the first inverting single-ended driver and the first non-inverting single-ended driver are defined to contend with each other to generate a first voltage on the first line of the differential channel.

In yet another aspect of this embodiment, the second inverting single-ended driver is defined to sink electrical current from the second line of the differential channel when the logic signal represents a high logic state. In a simultaneous manner, the second non-inverting single-ended driver is defined to source electrical current to the second line of the differential channel when the logic signal represents the high logic state. Also, when the logic signal represents a low logic state, the second inverting single-ended driver is defined to source electrical current to the second line of the differential channel, while the second non-inverting single-ended driver is defined to sink electrical current from the second line of the differential channel. Thus, the second inverting single-ended driver and the second non-inverting single-ended driver are defined to contend with each other to generate a second voltage on the second line of the differential channel. A difference between the first and second voltages on the first and second lines of the differential channel, respectively, define a differential signal generated by the output buffer.

In another embodiment, a method is disclosed for generating a differential signal. The method includes operating a first pair of single-ended drivers in contention with each other to generate a first signal based on a logic input signal, wherein the first signal defines a first voltage. The first pair of single-ended drivers are defined by a weaker inverting driver and a stronger non-inverting driver. The method also includes operating a second pair of single-ended drivers in contention with each other to generate a second signal based on the logic input signal, wherein the second signal defines a second voltage. The second pair of single-ended drivers are defined by a weaker non-inverting driver and a stronger inverting driver. The differential signal is defined by a difference between the first voltage and the second voltage.

In another aspect of this embodiment, one of the first pair of single-ended drivers is defined to sink current as the other of the first pair of single-ended drivers sources current. More specifically, when the logic input signal represents a high logic state, the weaker inverting driver of the first pair of single-ended drivers is operated to sink electrical current from the first signal. In a simultaneous manner, when the logic input signal represents the high logic state, the stronger non-inverting driver of the first pair of single-ended drivers is operated to source electrical current to the first signal. Conversely, when the logic input signal represents a low logic state, the weaker inverting driver of the first pair of single-ended drivers is operated to source electrical current to the first signal, while the stronger non-inverting driver of the first pair of single-ended drivers is operated to sink electrical current from the first signal. Because the first pair of single-ended drivers are operated in contention with each other, the method can further include an operation for configuring a drive strength of each of the first pair of single-ended drivers to control a voltage swing of the first signal.

In yet another aspect of this embodiment, one of the second pair of single-ended drivers is defined to sink current as the other of the second pair of single-ended drivers sources current. More specifically, when the logic input signal represents a high logic state, the stronger inverting driver of the second pair of single-ended drivers is operated to sink electrical current from the second signal. In a simultaneous manner, when the logic input signal represents the high logic state, the weaker non-inverting driver of the second pair of single-ended drivers is operated to source electrical current to the second signal. Conversely, when the logic input signal represents a low logic state, the stronger inverting driver of the second pair of single-ended drivers is operated to source electrical current to the second signal, while the weaker non-inverting driver of the second pair of single-ended drivers is operated to sink electrical current from the second signal. Because the second pair of single-ended drivers are operated in contention with each other, the method can further include an operation for configuring a drive strength of each of the second pair of single-ended drivers to control a voltage swing of the second signal.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
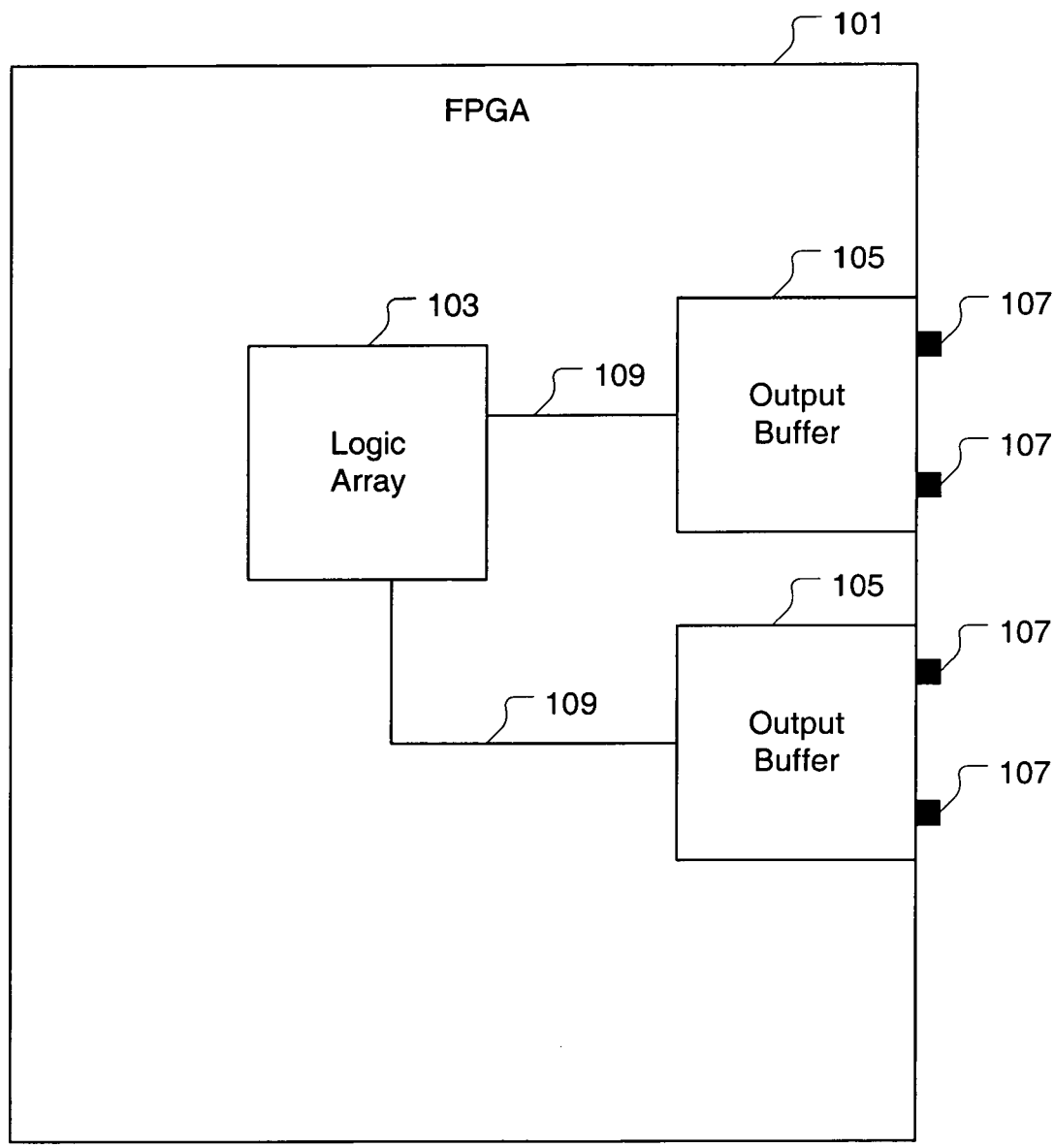
FIG. 1A is an illustration showing a FPGA including a number of output buffers defined to generate and transmit an output signal representative of a received logic signal.

FIG. 1A is an illustration showing a FPGA 101 including a number of output buffers 105 defined to generate and transmit an output signal representative of a received logic signal. Each of the output buffers 105 is connected to receive a logic signal from a logic array 103, via a respective connection 109. The signal generated by a particular output buffer 105 is transmitted from the FPGA 101 through one or more output pins 107 associated with the particular output buffer.

Figure 1B:
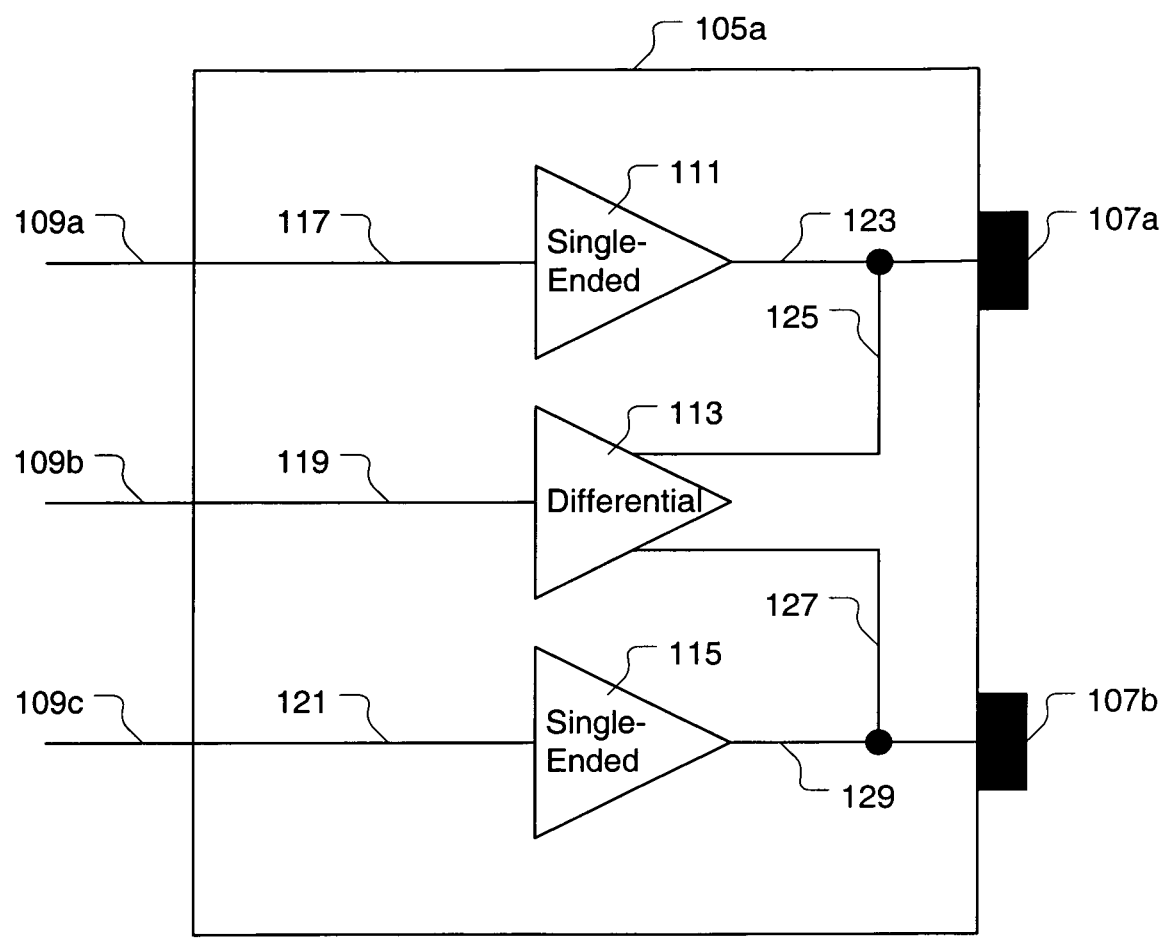
FIG. 1B is an illustration showing an internal structure of an output buffer designed to provide both differential and single-ended signaling capability.

FIG. 1B is an illustration showing an internal structure of an output buffer 105a designed to provide both differential and single-ended signaling capability. The output buffer 105a includes a first single-ended driver 111, a second single-ended driver 115, and a differential driver 113. Logic signals to be transmitted by the output buffer 105a are received on each of connections 109a, 109b, and 109c. The logic signal received on connection 109a is transmitted to the first single-ended driver 111 through a connection 117. The first single-ended driver 111 is defined to generate a single-ended output signal representing the received logic signal. The single-ended output signal generated by the first single-ended driver 111 is transmitted to an output pin 107a through a connection 123. In a similar manner, the logic signal received on connection 109c is transmitted to the second single-ended driver 115 through a connection 121. The second single-ended driver 115 is defined to generate a single-ended output signal representing the received logic signal. The single-ended output signal generated by the second single-ended driver 115 is transmitted to an output pin 107b through a connection 129. The logic signal received on connection 109b is transmitted to the differential driver 113 through a connection 119. The differential driver 113 is defined to generate a differential signal representing the received logic signal. The differential signal generated by the differential driver 113 is defined by a pair of signals, wherein each of the pair of signals is transmitted to a respective output pin 107a and 107b, through connections 125 and 129, respectively.

It should be appreciated that because output buffer 105a is defined on the FPGA 101, each connection within the output buffer 105a can be configured to be enabled or disabled by setting appropriate configuration bits in a configuration memory of the FPGA 101. Therefore, in one instance the output buffer 105a can be configured to transmit two separate single-ended signals by enabling the connections associated with each of the first and second single-ended drivers 111 and 115, while disabling the connections associated with the differential driver 113. More specifically, enabling connection 123 while disabling connection 125, allows the logic signal received on connection 109a to be transmitted by the first single-ended driver 111 to output pin 107a. Similarly, enabling connection 129 while disabling connection 127, allows the logic signal received on connection 109c to be transmitted by the second single-ended driver 115 to output pin 107b. It should be appreciated that in the present instance the unused differential driver 113 represents a wasted resource within the output buffer 105a.

In another instance, the output buffer 105a can be configured to transmit a differential signal representing the logic signal received on connection 109b by enabling the connections associated with the differential driver 113, while disabling the connections associated with the first and second single-ended drivers 111 and 115. More specifically, enabling connection 125 while disabling connection 123, allows the differential driver 113 to transmit one of the pair of signals defining the differential signal to output pin 107a. Also, enabling connection 127 while disabling connection 129, allows the differential driver 113 to transmit another of the pair of signals defining the differential signal to output pin 107b. It should be appreciated that in the present instance the unused first and second single-ended drivers 111 and 115 represent wasted resources within the output buffer 105a. Therefore, while the output buffer 105a satisfies a need within the FPGA 101 to provide an end-user with both single-ended signaling and LVDS capability, the output buffer 105a inevitably requires the end-user to pay for resources that are not used.

Figure 1C:
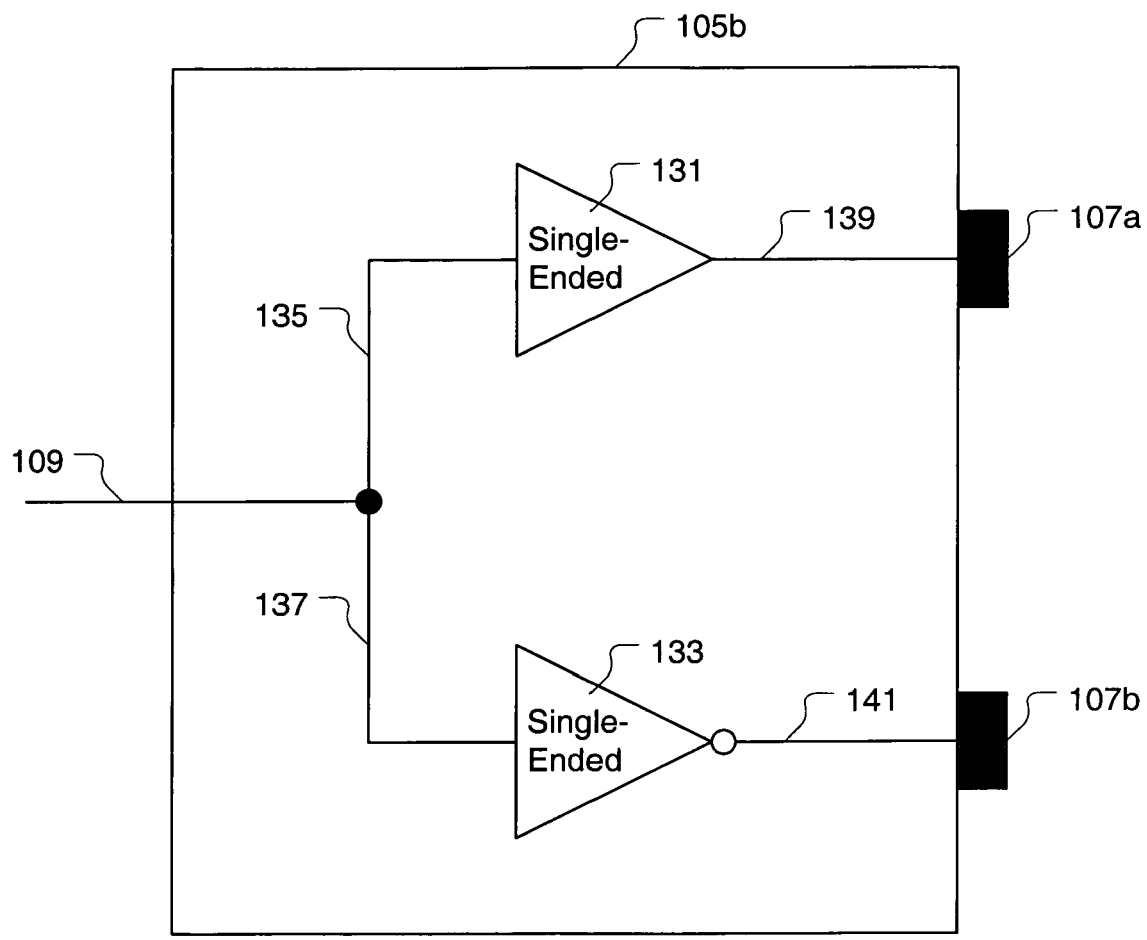
FIG. 1C is an illustration showing another output buffer intended to provide both single-ended signaling capability while partially supporting LVDS capability.

FIG. 1C is an illustration showing another output buffer 105b intended to provide both single-ended signaling capability while partially supporting LVDS capability. The output buffer 105b includes a single-ended driver 131 and an inverting single-ended driver 133. A logic signal to be transmitted by the output buffer 105b is received on connection 109. The logic signal received on connection 109 is transmitted to the single-ended driver 131 through a connection 135. The single-ended driver 131 is defined to generate a single-ended output signal representing the received logic signal. The single-ended output signal generated by the single-ended driver 131 is transmitted to the output pin 107a through a connection 139. In a similar manner, the logic signal received on connection 109 is also transmitted to the inverting single-ended driver 133 through a connection 137. The inverting single-ended driver 133 is defined to generate a single-ended output signal representing an inverted version of the received logic signal. The single-ended output signal generated by the inverting single-ended driver 133 is transmitted to the output pin 107b through a connection 141.

Because output buffer 105b is defined on the FPGA 101, each connection within the output buffer 105b can be configured to be enabled or disabled by setting appropriate configuration bits in the configuration memory of the FPGA 101. Therefore, in one instance the output buffer 105b can be configured to simply transmit a single-ended signal by enabling the connections associated with the single-ended driver 131. Similarly, if an inverted version of the logic signal received on connection 109 is needed, the output buffer 105b can be configured to enable the connections associated with the inverting single-ended driver 133. In yet another instance, the output buffer 105b can support generation of a differential signal by enabling each connection within the output buffer 105b. However, simply enabling each connection within the output buffer 105b to provide for generation of the single-ended signal on the output pin 107a and the inverted single-ended signal on the output pin 107b, is not sufficient to generate the differential signal. More specifically, the signals provided on each of the output pins 107a and 107b must be transmitted through a resistor network external to and downstream from the output buffer 105b.

Figure 2:
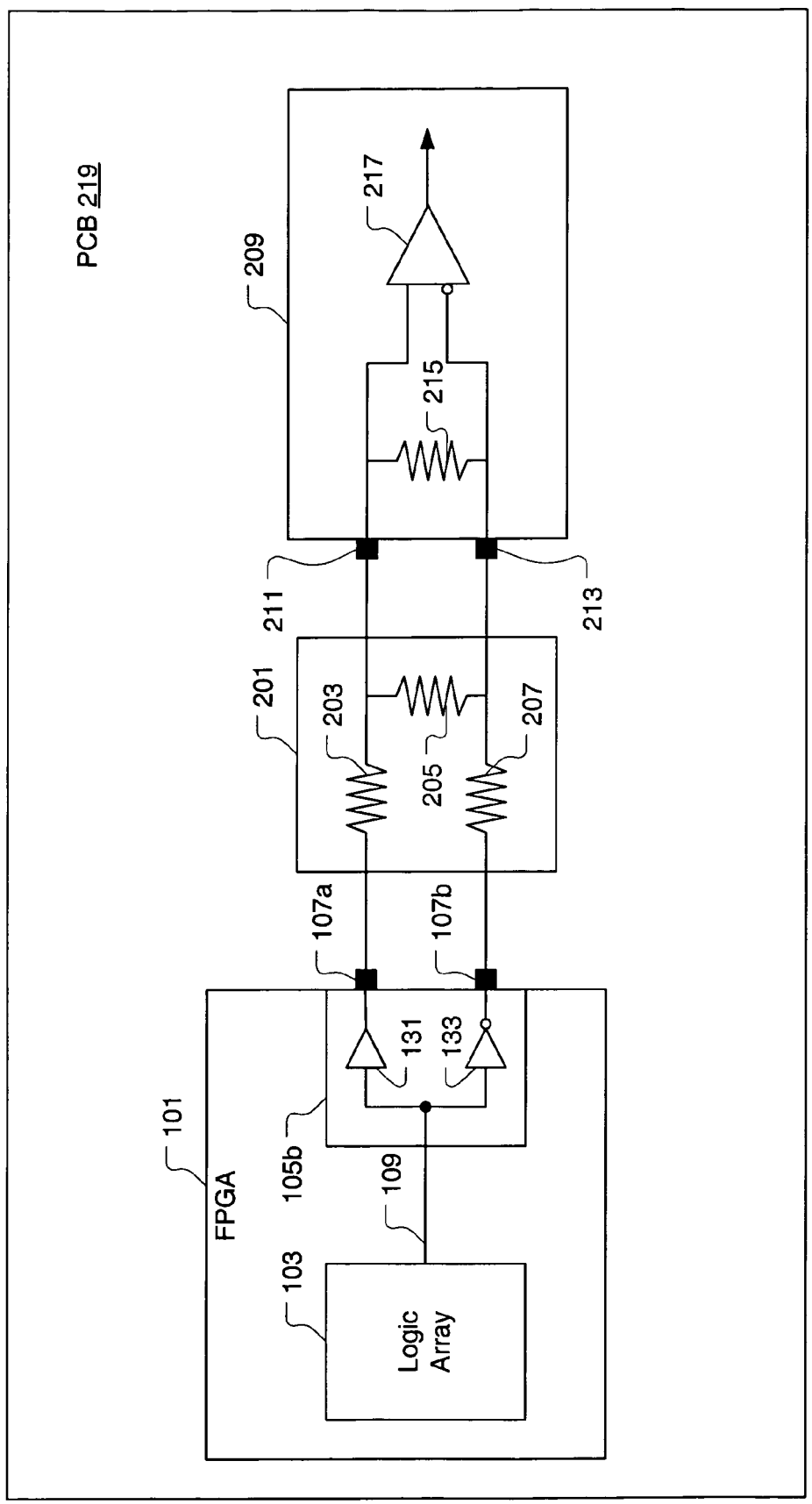
FIG. 2 is an illustration showing how to use two TTL buffers, one of which is inverted, with an external resistor network, to generate a differential signal.

FIG. 2 is an illustration showing how to use two TTL buffers, one of which is inverted, with an external resistor network, to generate a differential signal. The output buffer 105b is shown to be defined within the FPGA 101 to support transmission of a differential signal. As previously discussed, the output buffer 105b is defined to receive the logic signal on the connection 109 from the logic array 103. The single-ended driver 131 functions to transmit the single-ended signal on the output pin 107a. The inverting single-ended driver 133 functions to transmit the single-ended signal on the output pin 107b. The signals generated by the output buffer 105b on each of the output pins 107a and 107b are in communication with a resistor network 201.

The resistor network 201 includes a resistor 203 defined on a line connected to output pin 107a, a resistor 207 defined on a line connected to output pin 107b, and a resistor 205 defined between the lines connected to output pins 107a and 107b. The resistor network 201 operates to ensure that respective voltages present on input pins 211 and 213 of a receiver 209 are sufficiently defined such that a voltage differential between the input pins 211 and 213 is representative of the logic signal to be transmitted by the output buffer 105b. The receiver 209 includes a termination resistor 215 and a differential receiver 217. The termination resistor 215 combines with the resistor network 201 to establish the respective voltages received at the two inputs of the differential receiver 217. Those skilled in the art will appreciate that the differential receiver is capable of processing the two received inputs to generate a single-ended output, wherein this single-ended output represents the logic signal previously received by the output buffer on connection 109.

FIG. 2 further depicts the FPGA 101, the resistor network 201, and the receiver 209 as being defined on a PCB (printed circuit board) 219. Therefore, it should be appreciated that the differential signaling, i.e., LVDS, capability supported by the output buffer 105b is not fully implemented within the FPGA 101. The end-user of the FPGA 101 is required to define the resistor network 201 on the PCB 219 to fully implement the differential signaling capability. The required external resistor network 201 can be burdensome for the end-user. For example, having to define the external resistor network 201 on the PCB 219 can increase both cost and complexity of the end-user's device. Therefore, while the output buffer 105b provides an FPGA 101 end-user with flexibility in configuring either single-ended or differential signaling capability without use of the dedicated differential driver 113, the end-user of the FPGA 101 must contend with the external resistor network 201.

Figure 3:
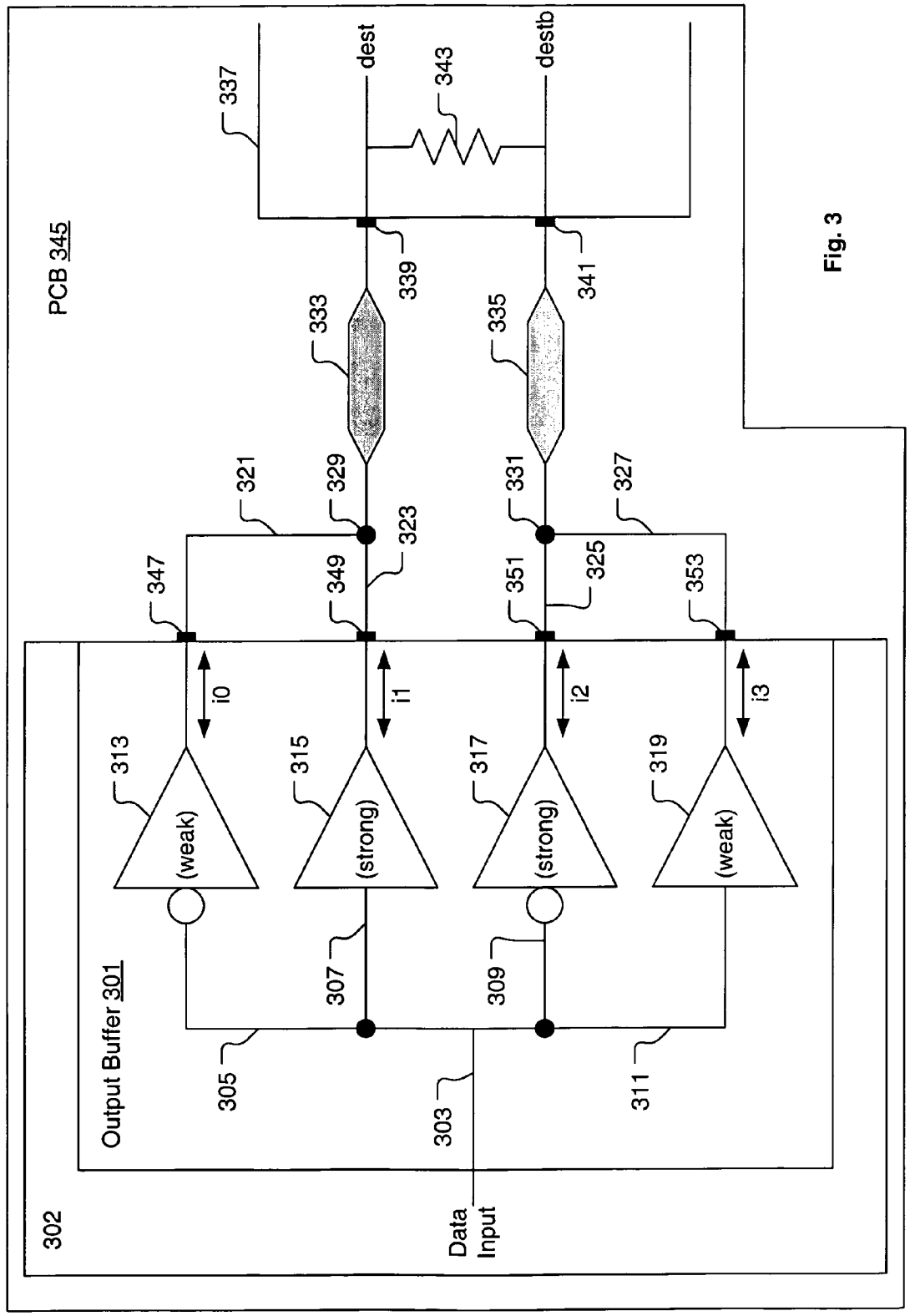
FIG. 3 is an illustration showing an output buffer, in accordance with one embodiment of the present invention.

The present invention provides an output buffer configuration that can support either single-ended signaling or differential signaling without the use of either the dedicated differential driver 113 or the external resistor network 201. FIG. 3 is an illustration showing an output buffer 301, in accordance with one embodiment of the present invention. For descriptive purposes, the output buffer 301 is shown as being defined within a FPGA 302, wherein the FPGA 302 is installed on a PCB 345. The output buffer 301 includes a first inverting single-ended driver 313, a first non-inverting single-ended driver 315, a second inverting single-ended driver 317, and a second single-ended non-inverting driver 319. The output buffer 301 is defined to receive a logic signal as a data input on a connection 303. It should be appreciated that the logic signal received on the connection 303 originates from a logic cell defined somewhere within the FPGA 302. The received logic signal is transmitted to an input of the first inverting single-ended driver 313 through a connection 305. The received logic signal is transmitted to an input of the first non-inverting single-ended driver 315 through a connection 307. The received logic signal is transmitted to an input of the second inverting single-ended driver 317 through a connection 309. The received logic signal is transmitted to an input of the second non-inverting single-ended driver 319 through a connection 311.

The first inverting single-ended driver 313 has an output connected to an output pin 347. The first non-inverting single-ended driver 315 has an output connected to an output pin 349. The second inverting single-ended driver 317 has an output connected to an output pin 351. The second non-inverting single-ended driver 319 has an output connected to an output pin 353. Thus, the output buffer 301 utilizes a total of four output pins.

It should be appreciated that because the output buffer 301 is defined within the FPGA 302, each connection within the output buffer 301 can be configured to be enabled or disabled. Therefore, if an end-user of the FPGA 302 simply wanted the output buffer 301 to generate a single-ended output signal, the connection 307 to the first non-inverting single-ended driver 315 can be enabled, while the connections to the other single-ended drivers 313, 317, and 319 are disabled. Then, a device external to the FPGA 302 can connect to the output pin 349 to receive the single-ended signal. Additionally, it should be appreciated that output buffer 301 can be configured to provide for generation of a single-ended signal by either of the single-ended drivers 313, 315, 317, and 319, through appropriate configuration of the connections 305, 307, 309, and 311 within the output buffer 301. While the output buffer 301 provides a variety of single-ended signaling capabilities, the remaining description of the output buffer 301 is directed to its differential signaling capability.

When the output buffer 301 is configured to provide differential signaling capability, the output pins 347, 349, 351, and 353 are required to be connected in a particular manner external to the FPGA 302. More specifically, the output pin 347 is directly connected to a node 329 via a connection 321. The output pin 349 is also directly connected to the node 329 via a connection 323. The node 329 represents an input end of a first transmission line ("line") 333 of a differential channel. Additionally, the output pin 351 is directly connected to a node 331 via a connection 325. The output pin 353 is also directly connected to the node 331 via a connection 327. The node 331 represents an input end of a second transmission line ("line") 335 of the differential channel.

The differential channel defined by the lines 333 and 335 extends between the nodes 329/331 and a receiving device 337. More specifically, the line 333 extends between node 329 and an input pin 339 of the receiving device 337. The line 335 extends between node 331 and an input pin 341 of the receiving device 337. Within the receiving device 337, a termination resistor 343 is defined between the input pins 339 and 341. Downstream from the termination resistor 343, the signal received on the input pin 339 is provided to a first input "dest" of a differential receiver (not shown). Similarly, downstream from the termination resistor 343, the signal received on the input pin 341 is provided to a second input "destb" of the differential receiver. As will be appreciated by those skilled in the art, the differential receiver is capable of processing the differential signals received at "dest" and "destb" to generate a single-ended signal that corresponds to the logic signal previously received at the data input connection 303 of the output buffer 301.

Referring back to the output buffer 301, it should be noted that the first inverting single-ended driver 313 is defined to have a weak drive strength relative to the first non-inverting single-ended driver 315. Thus, the first non-inverting single-ended driver 315 is characterized as having a stronger driver strength than the first inverting single-ended driver 313. Furthermore, the second inverting single-ended driver 317 is defined to have a drive strength substantially equivalent to the drive strength of the first non-inverting single-ended driver 315. Also, the second non-inverting single-ended driver 319 is defined to have a drive strength substantially equivalent to the drive strength of the first inverting single-ended driver 313. Therefore, the second inverting single-ended driver 317 is defined to have a stronger drive strength than the second non-inverting single-ended driver 319. The above description of driver strengths is summarized in FIG. 3 by the inclusion of either "(weak)" or "(strong)" labels on each of the single ended drivers 313, 315, 317, and 319.

Figure 4A:
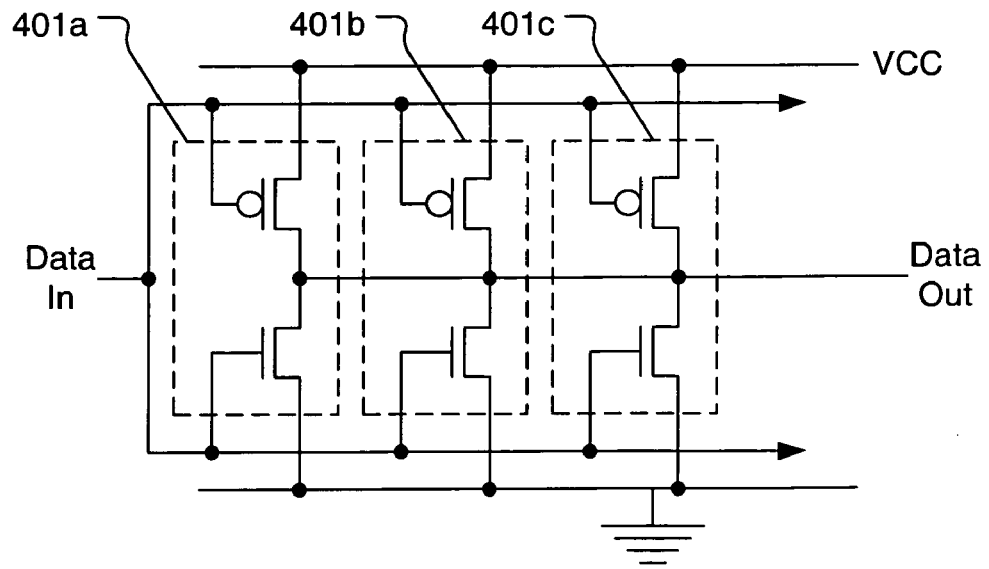
FIG. 4A is an illustration showing a circuit diagram for the inverting single-ended driver, in accordance with one embodiment of the present invention.

A drive strength for each of the single ended drivers 313, 315, 317, and 319, can be configured through the configuration memory of the FPGA 302. As discussed below, the differential signaling functionality of the output buffer 301 is influenced by the particular drive strength settings of each of the single ended drivers 313, 315, 317, and 319. FIG. 4A is an illustration showing a circuit diagram for the inverting single-ended drivers 313 and 317, in accordance with one embodiment of the present invention. The inverting single-ended driver is defined by a number of stages 401*a*-401*c*, wherein each stage 401*a*-401*c* includes a PMOS device and an NMOS device connected as shown in FIG. 4A. Although FIG. 4A shows three stages 401*a*-401*c* for ease of discussion, it should be appreciated that the inverting single-ended driver can include any number of stages as afforded by the FPGA 302 architecture.

The logic signal received as input to the inverting single-ended driver is used to control the gate of each PMOS and NMOS device in each stage 401*a*-401*c*. The outputs of the stages 401*a*-401*c* are combined to provide the output of the inverting single-ended driver. Therefore, given that each PMOS and NMOS device in each stage 401*a*-401*c* is defined to have a fixed drive strength at the time the FPGA 302 is manufactured, the overall drive strength of the inverting single-ended driver is defined by the number of stages 401*a*-401*c* that are configured to be enabled based on the settings in the configuration memory of the FPGA 302.

Figure 4B:
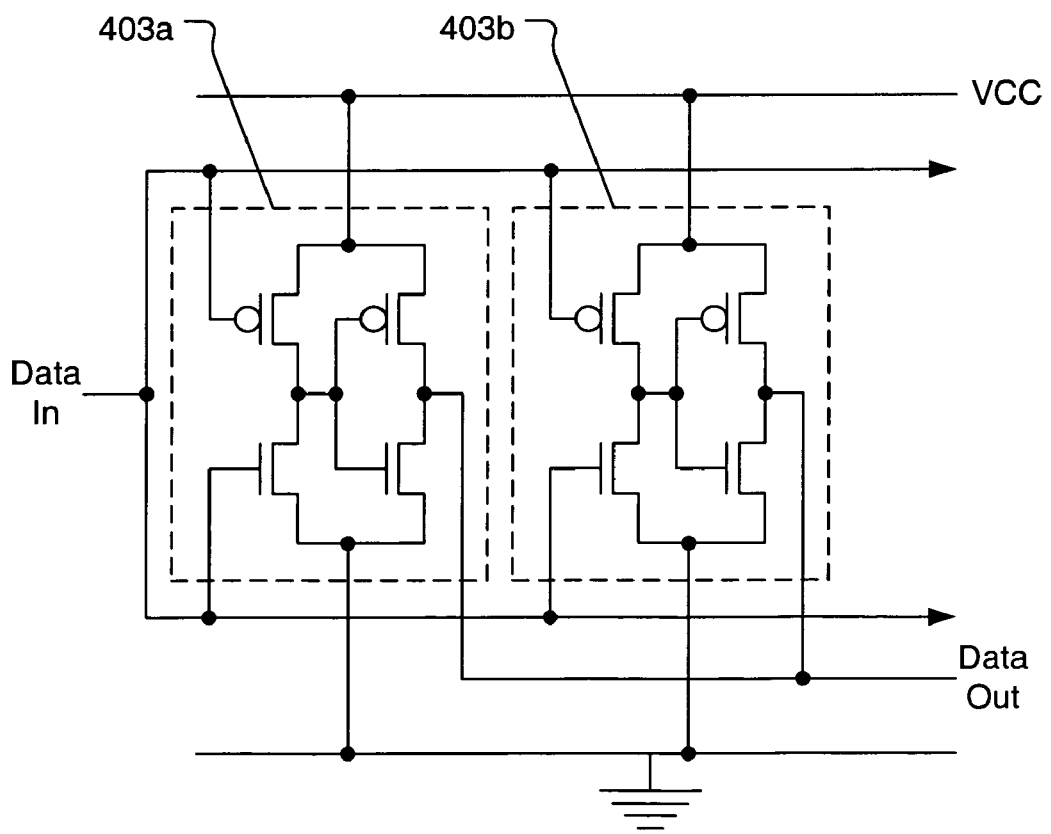
FIG. 4B is an illustration showing a circuit diagram for the non-inverting single-ended driver, in accordance with one embodiment of the present invention.

FIG. 4B is an illustration showing a circuit diagram for the non-inverting single-ended drivers 315 and 319, in accordance with one embodiment of the present invention. The non-inverting single-ended driver is defined by a number of stages 403*a*-403*b*, wherein each stage 403*a*-403*b* includes a pair of PMOS devices and a pair of NMOS devices connected as shown in FIG. 4B. Although FIG. 4B shows two stages 403*a*-403*b* for ease of discussion, it should be appreciated that the non-inverting single-ended driver can include any number of stages as afforded by the FPGA 302 architecture.

The logic signal received as input to the non-inverting single-ended driver is used to control the gate of a first PMOS device and a first NMOS device in each stage 403*a*-403*b*. The drain of the first PMOS device and the source of the first NMOS device are connected together to control the gate of a second PMOS device and a second NMOS device is each stage 403*a*-403*b*. The drain of the second PMOS device and the source of the second NMOS device are connected together to provide the output of each stage 403*a*-403*b*. The outputs of the stages 403*a*-403*b* are combined to provide the output of the non-inverting single-ended driver. Therefore, given that each PMOS and NMOS device in each stage 403*a*-403*b* is defined to have a fixed drive strength at the time the FPGA 302 is manufactured, the overall drive strength of the non-inverting single-ended driver is defined by the number of stages 403*a*-403*b* that are configured to be enabled based on the settings in the configuration memory of the FPGA 302.

During operation of the output buffer 301, the first inverting single-ended driver 313 and the first non-inverting single-ended driver 315 are defined to work against each other with respect to driving a signal on the line 333 of the differential channel. If the logic signal received by the output buffer on connection 303 corresponds to a high logic state, the weaker inverting single-ended driver 313 will operate to sink current from the node 329. Also when the logic signal received by the output buffer on connection 303 corresponds to the high logic state, stronger non-inverting single-ended driver 315 will operate to source current to the node 329. Thus, when the output buffer 301 is to transmit a differential signal representing a high logic state, the stronger non-inverting single-ended driver 315 will source current to node 329, while the weaker inverting single-ended driver 313 simultaneously sinks current from node 329. The contention between drivers 313 and 315 serves to limit a voltage increase on the line 333 when transmitting a differential signal representing a high logic state.

Additionally, the second inverting single-ended driver 317 and the second non-inverting single-ended driver 319 are defined to work against each other with respect to driving a signal on the line 335 of the differential channel. If the logic signal received by the output buffer 301 on connection 303 corresponds to the high logic state, the stronger inverting single-ended driver 317 will operate to sink current from the node 331. Also when the logic signal received by the output buffer on connection 303 corresponds to the high logic state, weaker non-inverting single-ended driver 319 will operate to source current to the node 331. Thus, when the output buffer 301 is to transmit a differential signal representing the high logic state, the stronger inverting single-ended driver 317 will sink current from node 331, while the weaker non-inverting single-ended driver 319 simultaneously sources current to node 331. The contention between drivers 317 and 319 serves to limit a voltage decrease on the line 335 when transmitting a differential signal representing a high logic state.

If the logic signal received by the output buffer on connection 303 corresponds to a low logic state, the weaker inverting single-ended driver 313 will operate to source current to the node 329. Also when the logic signal received by the output buffer on connection 303 corresponds to the low logic state, the stronger non-inverting single-ended driver 315 will operate to sink current from the node 329. Thus, when the output buffer 301 is to transmit a differential signal representing a low logic state, the stronger non-inverting single-ended driver 315 will sink current from node 329, while the weaker inverting single-ended driver 313 simultaneously sources current to node 329. The contention between drivers 313 and 315 serves to limit a voltage decrease on the line 333 when transmitting a differential signal representing a low logic state.

If the logic signal received by the output buffer 301 on connection 303 corresponds to the low logic state, the stronger inverting single-ended driver 317 will operate to source current to the node 331. Also when the logic signal received by the output buffer on connection 303 corresponds to the low logic state, weaker non-inverting single-ended driver 319 will operate to sink current from the node 331. Thus, when the output buffer 301 is to transmit a differential signal representing the low logic state, the stronger inverting single-ended driver 317 will source current to node 331, while the weaker non-inverting single-ended driver 319 simultaneously sinks current from node 331. The contention between drivers 317 and 319 serves to limit a voltage increase on the line 335 when transmitting a differential signal representing a low logic state.

In accordance with the foregoing, transmission of a high logic state differential signal by the output buffer 301 corresponds to generating a higher voltage on line 333 and a lower voltage on line 335, wherein the specific voltage on line 333 is controlled by drivers 313 and 315 and the specific voltage on line 335 is controlled by drivers 317 and 319. Also, transmission of a low logic state differential signal by the output buffer 301 corresponds to generating a lower voltage on line 333 and a higher voltage on line 335, wherein the specific voltage on line 333 is controlled by drivers 313 and 315 and the specific voltage on line 335 is controlled by drivers 317 and 319. It should be appreciated that the contention between drivers 313 and 315 serves to limit a voltage excursion on line 333 of the differential channel. It should be further appreciated that the contention between drivers 317 and 319 serves to limit a voltage excursion on line 335 of the differential channel.

By appropriately configuring the drive strengths drivers 313, 315, 317, and 319, the differential voltage and common mode voltage on lines 333 and 335 can be controlled. Additionally, a voltage swing on lines 333 and 335 when changing from transmission of a high logic state to a low logic state, vice-versa, can be minimized. Thus, the output buffer 301 provides LVDS capability without requiring either a dedicated differential driver or a resistor network external to the FPGA 302.

To illustrate the functionality of the output buffer 301, a number of experiments were performed. Table 1 documents a portion of the performed experiments. The experiments reported in Table 1 correspond to the output buffer 301 as previously described with respect to FIGS. 3-4, with a VCC of 2.5 V, a termination resistor 343 of 100 ohms, and an input frequency on connection 303 of 600 MHz. In Table 1, the column labeled "Current Strength/Strong Driver" provides the configured drive strength of the stronger single-ended drivers 315 and 317. The column labeled "Current Strength/Weak Driver" provides the configured drive strength of the weaker single-ended drivers 313 and 319. It should be understood that the drive strengths reported in Table 1 correspond to the particular drivers is isolation.

The values reported in the column labeled "Voltage/Voh" represent the highest single-ended voltage present on lines 333 and 335. The values reported in the column labeled "Voltage/Vol" represent the lowest single-ended voltage present on lines 333 and 335. The values reported in the column labeled "Voltage/Vod" represent the differential voltage between the lines 333 and 335. The values reported in the column labeled "Voltage/Vcm" represent the common mode voltage between the lines 333 and 335.

Table 1 also reports the DC currents through each of the drivers 313, 315, 317, and 319. The current-through the inverting single-ended driver 313 is identified as "i0" in both FIG. 3 and Table 1. The current through the non-inverting single-ended driver 315 is identified as "i1" in both FIG. 3 and Table 1. The current through the inverting single-ended driver 317 is identified as "i2" in both FIG. 3 and Table 1. The current through the non-inverting single-ended driver 319 is identified as "i3" in both FIG. 3 and Table 1. It should be appreciated that the direction of current flow through a particular driver is dependent upon whether a logic state being transmitted by the output buffer 301 is high or low. For a high logic state transmission, the current flows into drivers 313 and 317, and out of drivers 315 and 319. For a low logic state transmission, the current flows into drivers 315 and 319, and out of drivers 313 and 317.

TABLE 1

| Current Strength (mA) | | Voltage (mV) | | | | Current (mA) | | | |
|---|---|---|---|---|---|---|---|---|---|
| Strong Drivers | Weak Drivers | Voh | Vol | Vod | Vcm | i0 | i1 | i2 | i3 |
| 16 | 4 | 2231 | 1491 | 677 | 1860 | 38 | 51 | 32 | 19 |
| 16 | 8 | 2220 | 1750 | 419 | 1987 | 49 | 56 | 36 | 29 |
| 16 | 12 | 2162 | 2025 | 108 | 2093 | 56 | 57 | 49 | 48 |

TABLE 1-continued

| Current Strength (mA) | | Voltage (mV) | | | | Current (mA) | | | |
|---|---|---|---|---|---|---|---|---|---|
| Strong Drivers | Weak Drivers | Voh | Vol | Vod | Vcm | i0 | i1 | i2 | i3 |
| 12 | 4 | 2229 | 1654 | 526 | 1940 | 36 | 45 | 29 | 19 |
| 12 | 8 | 2207 | 1890 | 293 | 2048 | 43 | 47 | 33 | 29 |
| 8 | 4 | 2195 | 1989 | 186 | 2092 | 25 | 28 | 22 | 19 |

Figure 5:
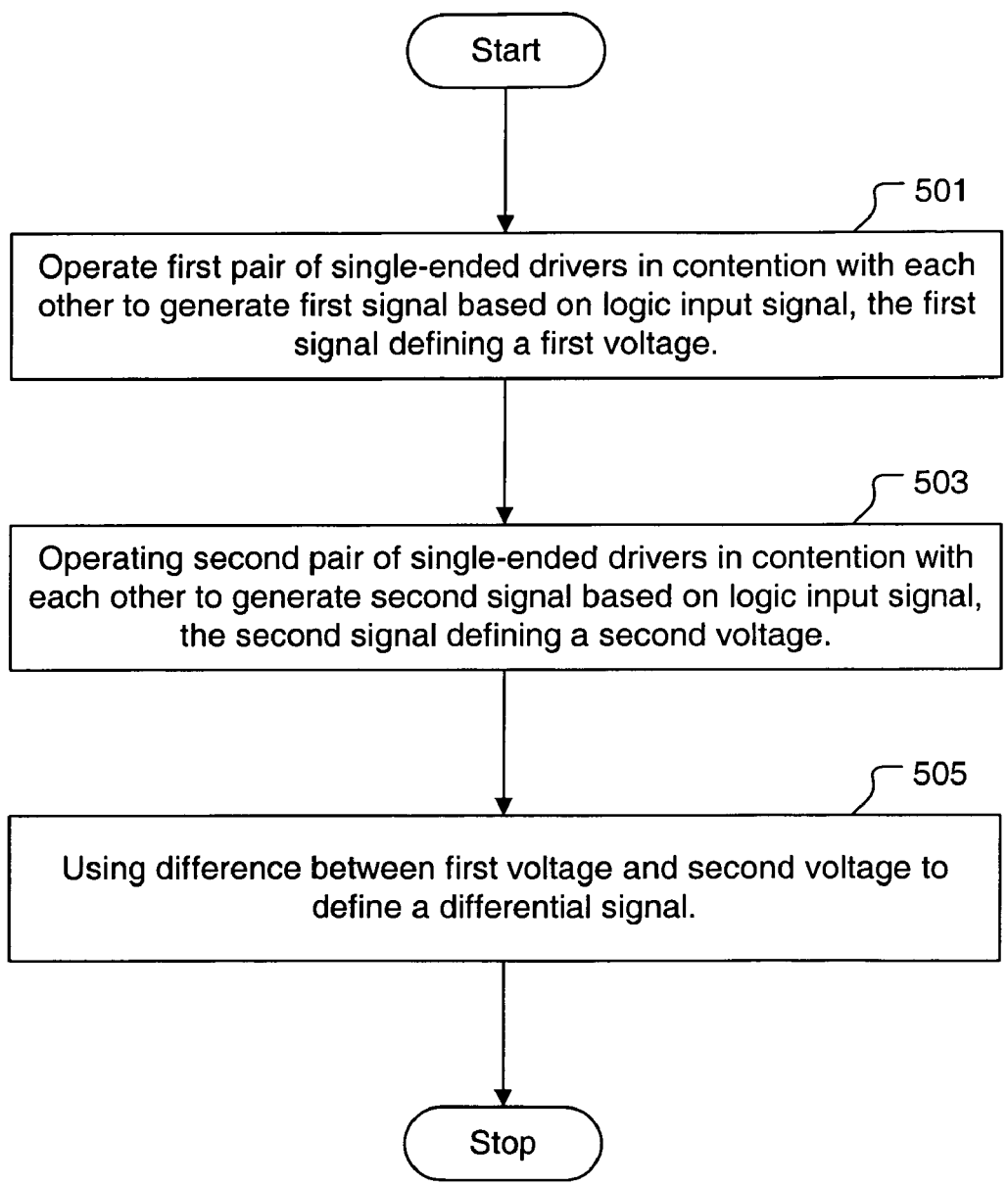
FIG. 5 is an illustration showing a flowchart of a method for generating a differential signal, in accordance with one embodiment of the present invention.

FIG. 5 is an illustration showing a flowchart of a method for generating a differential signal, in accordance with one embodiment of the present invention. The method includes an operation 501 for operating a first pair of single-ended drivers in contention with each other to generate a first signal based on a received logic input signal. The generated first signal defines a first voltage. Also, the contention between the first pair of single-ended drivers is afforded by defining one of the first pair of single-ended drivers to be a weaker inverting driver and a second of the first pair of single-ended drivers to be a stronger non-inverting driver. It should be appreciated the each of the first pair of single-ended drivers is connected to receive the same logic input signal. Also, the respective outputs of the first pair of single-ended drivers are connected together to generate the first signal.

The method also includes an operation 503 for operating a second pair of single-ended drivers in contention with each other to generate a second signal based on the received logic input signal. The generated second signal defines a second voltage. Also, the contention between the second pair of single-ended drivers is afforded by defining one of the second pair of single-ended drivers to be a stronger inverting driver and a second of the second pair of single-ended drivers to be a weaker non-inverting driver. It should be appreciated the each of the second pair of single-ended drivers is connected to receive the same logic input signal. Also, the respective outputs of the second pair of single-ended drivers are connected together to generate the second signal. The method further includes an operation 505 for using a difference between the first voltage corresponding to the first signal and the second voltage corresponding to the second signal to define a differential signal.

It should be appreciated that because the first pair of single-ended drivers are operated in contention with each other, one of the first pair of single-ended drivers is defined to sink current as the other of the first pair of single-ended drivers sources current. Similarly, because the second pair of single-ended drivers are operated in contention with each other, one of the second pair of single-ended drivers is defined to sink current as the other of the second pair of single-ended drivers sources current. Additionally, in an FPGA context, each of the first pair of single-ended drivers and each of the second pair of single-ended drivers is configurable with respect to their particular drive strength characteristics. Therefore, the method can also include an operation for configuring a drive strength of each of the first pair of single-ended drivers to control a voltage swing of the first signal. Additionally, the method can include an operation for configuring a drive strength of each of the second pair of single-ended drivers to control a voltage swing of the second signal.

Figure 6:
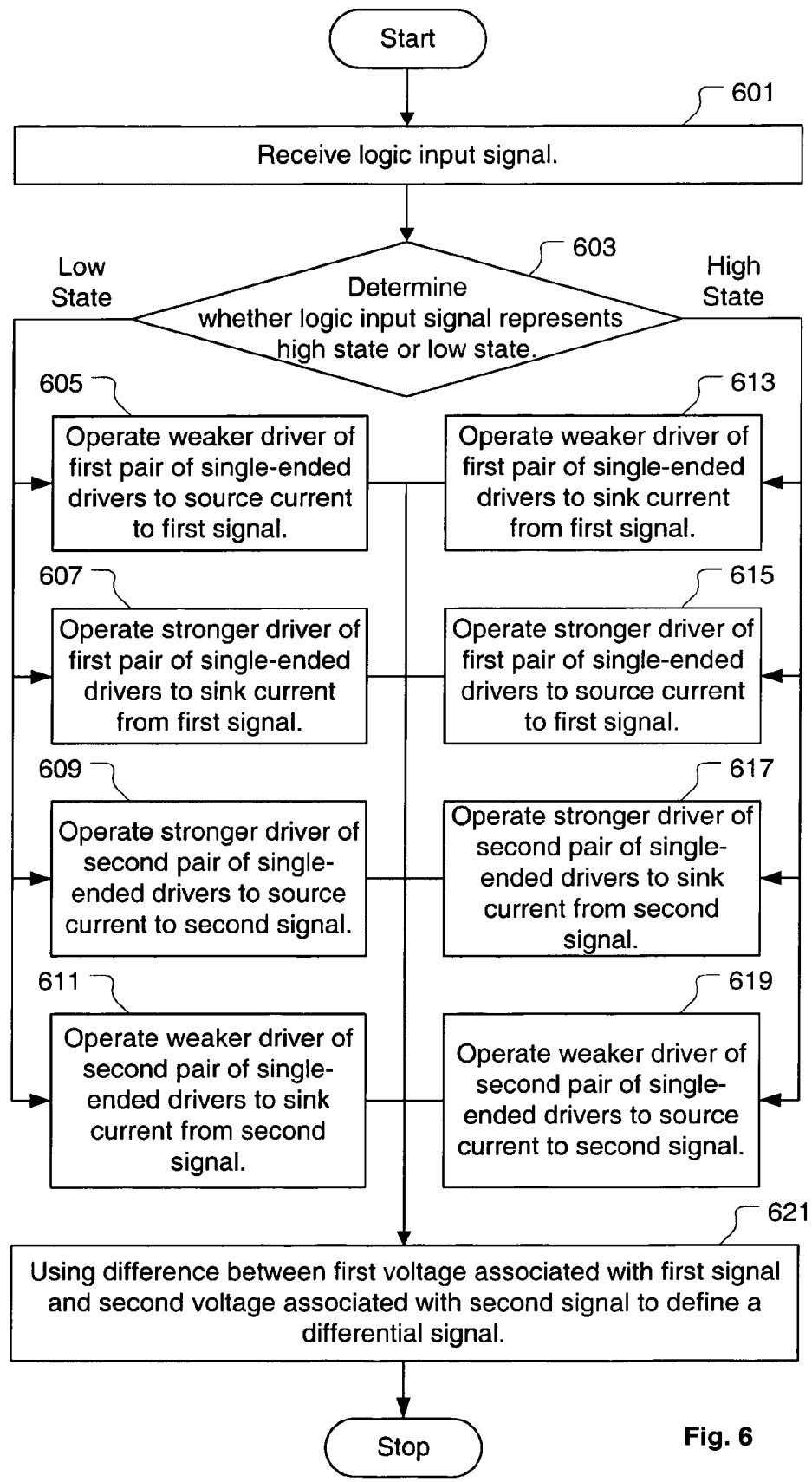
FIG. 6 is an illustration showing a flowchart of a method for generating a differential signal, in accordance with another embodiment of the present invention.

FIG. 6 is an illustration showing a flowchart of a method for generating a differential signal, in accordance with another embodiment of the present invention. The method includes an operation 601 for receiving a logic input signal corresponding to either a high logic state or a low logic state to be represented by a generated differential signal. The method includes an operation 603 for determining whether the received logic input signal represents the high logic state or the low logic state. If the received logic input signal represents the low logic state, the method simultaneously proceeds with operations 605, 607, 609, and 611.

In operation 605, a weaker driver of a first pair of single-ended drivers is operated to source current to a line upon which a first signal is being generated. In operation 607, a stronger driver of the first pair of single-ended drivers is operated to sink current from the line upon which the first signal is being generated. Thus, the first signal generated is based on contention between the weaker and stronger drivers in the first pair of single-ended drivers. In operation 609, a stronger driver of a second pair of single-ended drivers is operated to source current to a line upon which a second signal is being generated. In operation 611, a weaker driver of the second pair of single-ended drivers is operated to sink current from the line upon which the second signal is being generated. Thus, the second signal generated is based on contention between the weaker and stronger drivers in the second pair of single-ended drivers. Following operations 605, 607, 609, and 611, the method proceeds with an operation 621 in which a difference between a first voltage associated with the first signal and a second voltage associated with the second signal is used to define a differential signal, wherein the differential signal represents a low logic state.

Referring back to the operation 603, if the received logic input signal represents the high logic state, the method simultaneously proceeds with operations 613, 615, 617, and 619. In operation 613, the weaker driver of the first pair of single-ended drivers is operated to sink current from the line upon which the first signal is being generated. In operation 615, the stronger driver of the first pair of single-ended drivers is operated to source current to the line upon which the first signal is being generated. Thus, the first signal generated is based on contention between the weaker and stronger drivers in the first pair of single-ended drivers. In operation 617, the stronger driver of the second pair of single-ended drivers is operated to sink current from the line upon which a second signal is being generated. In operation 619, the weaker driver of the second pair of single-ended drivers is operated to source current to the line upon which the second signal is being generated. Thus, the second signal generated is based on contention between the weaker and stronger drivers in the second pair of single-ended drivers. Following operations 613, 615, 617, and 619, the method proceeds with the operation 621 in which the difference between the first voltage associated with the first signal and the second voltage associated with the second signal is used to define the differential signal, wherein the differential signal represents a high logic state.

The apparatus and method for generating a differential signal as described herein may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any other suitable application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A circuit for generating a differential signal, comprising:
 a first pair of single-ended drivers each having a respective output connected to a first line of a differential channel for transmission of electric current between the first line of the differential channel and each output of the first pair of single-ended drivers, the first pair of single-ended drivers defined to work against each other with respect to driving a first signal on the first line of the differential channel; and
 a second pair of single-ended drivers each having a respective output connected to a second line of the differential channel for transmission of electric current between the second line of the differential channel and each output of the second pair of single-ended drivers, the second pair of single-ended drivers defined to work against each other with respect to driving a second signal on the second line of the differential channel,
 wherein each of the first pair of single-ended drivers and each of the second pair of single-ended drivers is connected to receive a common input signal.

2. A circuit for generating a differential signal as recited in claim 1, wherein a weaker one of the first pair of single-ended drivers is defined as an inverting single-ended driver having a weaker drive strength than the other one of the first pair of single-ended drivers.

3. A circuit for generating a differential signal as recited in claim 2, wherein the weaker one of the first pair of single-ended drivers is defined to sink electrical current from the first line of the differential channel when the common input signal represents a high logic state, the other one of the first pair of single-ended drivers defined to source electrical current to the first line of the differential channel when the common input signal represents the high logic state.

4. A circuit for generating a differential signal as recited in claim 2, wherein the weaker one of the first pair of single-ended drivers is defined to source electrical current to the first line of the differential channel when the common input signal represents a low logic state, the other one of the first pair of single-ended drivers defined to sink electrical current from the first line of the differential channel when the common input signal represents the low logic state.

5. A circuit for generating a differential signal as recited in claim 1, wherein a stronger one of the second pair of single-ended drivers is defined as an inverting single-ended driver having a stronger drive strength than the other of the second pair of single-ended drivers.

6. A circuit for generating a differential signal as recited in claim 5, wherein the stronger one of the second pair of single-ended drivers is defined to sink electrical current from the second line of the differential channel when the common input signal represents a high logic state, the other one of the second pair of single-ended drivers defined to source electrical current to the second line of the differential channel when the common input signal represents the high logic state.

7. A circuit for generating a differential signal as recited in claim 5, wherein the stronger one of the second pair of single-ended drivers is defined to source electrical current to the second line of the differential channel when the common input signal represents a low logic state, the other one of the second pair of single-ended drivers defined to sink electrical current from the second line of the differential channel when the common input signal represents the low logic state.

8. A field programmable gate array output buffer, comprising:
 a first inverting single-ended driver having an input connected to receive a logic signal to be transmitted by the output buffer, the first inverting single-ended driver having an output connected to a first line of a differential channel;
 a first non-inverting single-ended driver having an input connected to receive the logic signal to be transmitted by the output buffer, the first non-inverting single-ended driver having an output connected to the first line of the differential channel, the first non-inverting single-ended driver having a stronger drive strength than the first inverting single-ended driver;
 a second inverting single-ended driver having an input connected to receive the logic signal to be transmitted by the output buffer, the second inverting single-ended driver having an output connected to a second line of the differential channel; and
 a second non-inverting single-ended driver having an input connected to receive the logic signal to be transmitted by the output buffer, the second non-inverting single-ended driver having an output connected to the second line of the differential channel, the second non-inverting single-ended driver having a weaker drive strength than the second inverting single-ended driver.

9. A field programmable gate array output buffer as recited in claim 8, wherein the output of the first inverting single-ended driver is connected to the output of the first non-inverting single-ended driver at a connection to the first line of the differential channel.

10. A field programmable gate array output buffer as recited in claim 8, wherein the output of the second inverting single-ended driver is connected to the output of the second non-inverting single-ended driver at a connection to the second line of the differential channel.

11. A field programmable gate array output buffer as recited in claim 8, wherein the first inverting single-ended driver is defined to sink electrical current from the first line of the differential channel when the logic signal represents a high logic state, the first non-inverting single-ended driver defined to source electrical current to the first line of the differential channel when the logic signal represents the high logic state, and
 the first inverting single-ended driver defined to source electrical current to the first line of the differential channel when the logic signal represents a low logic state, the first non-inverting single-ended driver defined to sink electrical current from the first line of the differential channel when the logic signal represents the low logic state.

12. A field programmable gate array output buffer as recited in claim 8, wherein the second inverting single-ended driver is defined to sink electrical current from the second line of the differential channel when the logic signal represents a high logic state, the second non-inverting single-ended driver defined to source electrical current to the second line of the differential channel when the logic signal represents the high logic state, and
 the second inverting single-ended driver defined to source electrical current to the second line of the differential channel when the logic signal represents a low logic state, the second non-inverting single-ended driver defined to sink electrical current from the second line of the differential channel when the logic signal represents the low logic state.

13. A field programmable gate array output buffer as recited in claim 8, wherein each of the first and second inverting single-ended drivers and each of the first and second non-inverting single-ended drivers is configurable with respect to drive strength.

14. A field programmable gate array output buffer as recited in claim 8, wherein the first inverting single-ended driver and the first non-inverting single-ended driver are defined to contend with each other to generate a first voltage on the first line of the differential channel, the second inverting single-ended driver and the second non-inverting single-ended driver defined to contend with each other to generate a second voltage on the second line of the differential channel, a difference between the first and second voltages defining a differential signal generated by the output buffer.

15. A method for generating a differential signal, comprising:
 operating a first pair of single-ended drivers in contention with each other to generate a first signal based on a logic input signal, the first signal defining a first voltage, the first pair of single-ended drivers being defined by a weaker inverting driver and a stronger non-inverting driver; and
 operating a second pair of single-ended drivers in contention with each other to generate a second signal based on the logic input signal, the second signal defining a second voltage, the second pair of single-ended drivers being defined by a weaker non-inverting driver and a stronger inverting driver,
 wherein a difference between the first voltage and the second voltage represents the differential signal.

16. A method for generating a differential signal as recited in claim 15, further comprising:
 connecting an output of each of the first pair of single-ended drivers together to generate the first signal; and
 connecting an output of each of the second pair of single-ended drivers together to generate the second signal.

17. A method for generating a differential signal as recited in claim 15, wherein one of the first pair of single-ended drivers is defined to sink current as the other of the first pair of single-ended drivers sources current, and
 wherein one of the second pair of single-ended drivers is defined to sink current as the other of the second pair of single-ended drivers sources current.

18. A method for generating a differential signal as recited in claim 15, further comprising:
 configuring a drive strength of each of the first pair of single-ended drivers to control a voltage swing of the first signal; and
 configuring a drive strength of each of the second pair of single-ended drivers to control a voltage swing of the second signal.

19. A method for generating a differential signal as recited in claim 15, further comprising:

operating the weaker inverting driver of the first pair of single-ended drivers to sink electrical current from the first signal when the logic input signal represents a high logic state;

operating the stronger non-inverting driver of the first pair of single-ended drivers to source electrical current to the first signal when the logic input signal represents a high logic state;

operating the weaker inverting driver of the first pair of single-ended drivers to source electrical current to the first signal when the logic input signal represents a low logic state; and operating the stronger non-inverting driver of the first pair of single-ended drivers to sink electrical current from the first signal when the logic input signal represents a low logic state.

20. A method for generating a differential signal as recited in claim 15, further comprising:

operating the stronger inverting driver of the second pair of single-ended drivers to sink electrical current from the second signal when the logic input signal represents a high logic state;

operating the weaker non-inverting driver of the second pair of single-ended drivers to source electrical current to the second signal when the logic input signal represents a high logic state;

operating the stronger inverting driver of the second pair of single-ended drivers to source electrical current to the second signal when the logic input signal represents a low logic state; and operating the weaker non-inverting driver of the second pair of single-ended drivers to sink electrical current from the second signal when the logic input signal represents a low logic state.

* * * * *